United States Patent
Ishihara

(10) Patent No.: US 9,207,299 B2
(45) Date of Patent: Dec. 8, 2015

(54) MAGNETIC RESONANCE IMAGING SYSTEM AND MAGNETIC RESONANCE IMAGING APPARATUS

(75) Inventor: Yasutoshi Ishihara, Nagaoka (JP)

(73) Assignees: KABUSHIKI KAISHA TOSHIBA, Tokyo (JP); TOSHIBA MEDICAL SYSTEMS CORPORATION, Otawara-Shi (JP)

( * ) Notice: Subject to any disclaimer, the term of this patent is extended or adjusted under 35 U.S.C. 154(b) by 150 days.

(21) Appl. No.: 11/362,723

(22) Filed: Feb. 28, 2006

(65) Prior Publication Data

US 2007/0238976 A1 Oct. 11, 2007

(51) Int. Cl.
*A61B 5/05* (2006.01)
*G01R 33/48* (2006.01)
*G01R 33/565* (2006.01)

(52) U.S. Cl.
CPC ........ *G01R 33/4804* (2013.01); *G01R 33/4814* (2013.01); *G01R 33/56509* (2013.01)

(58) Field of Classification Search
CPC ..................... G01R 33/4804; G01R 33/56509; G01R 33/4814; A61B 5/05
USPC .................................. 600/410–413; 601/2, 3
See application file for complete search history.

(56) References Cited

U.S. PATENT DOCUMENTS

| | | | | |
|---|---|---|---|---|
| 5,284,144 A * | 2/1994 | Delannoy et al. | ............. | 600/412 |
| 5,378,987 A * | 1/1995 | Ishihara et al. | ............. | 324/315 |
| 5,590,653 A * | 1/1997 | Aida et al. | .................... | 600/411 |
| 5,681,282 A * | 10/1997 | Eggers et al. | ................. | 604/114 |
| 5,916,161 A * | 6/1999 | Ishihara et al. | ............. | 600/410 |
| 6,194,899 B1 * | 2/2001 | Ishihara et al. | ............. | 324/315 |
| 2002/0193681 A1* | 12/2002 | Vitek et al. | ................... | 600/411 |
| 2004/0039280 A1* | 2/2004 | Wu et al. | ...................... | 600/412 |
| 2005/0137659 A1* | 6/2005 | Garabedian et al. | ............ | 607/96 |

FOREIGN PATENT DOCUMENTS

| | | |
|---|---|---|
| JP | 5-253192 | 10/1993 |
| JP | 8-252231 | 10/1996 |

OTHER PUBLICATIONS

Zhang et al., A Method for Simultaneous RF Ablation and MRI, 1998, JMRI, 8, 110-114.*

* cited by examiner

*Primary Examiner* — Bo J Peng
(74) *Attorney, Agent, or Firm* — Nixon & Vanderhye P.C.

(57) ABSTRACT

A magnetic resonance imaging system measures the temperature of a morbid region to be heated in thermotherapy and controls a scan unit to execute an imaging operation in synchronism with heating by a heating device, and generates measurement temperature data on the basis of the phase change of magnetic resonance signals at different generation times obtained by the imaging operation.

17 Claims, 8 Drawing Sheets

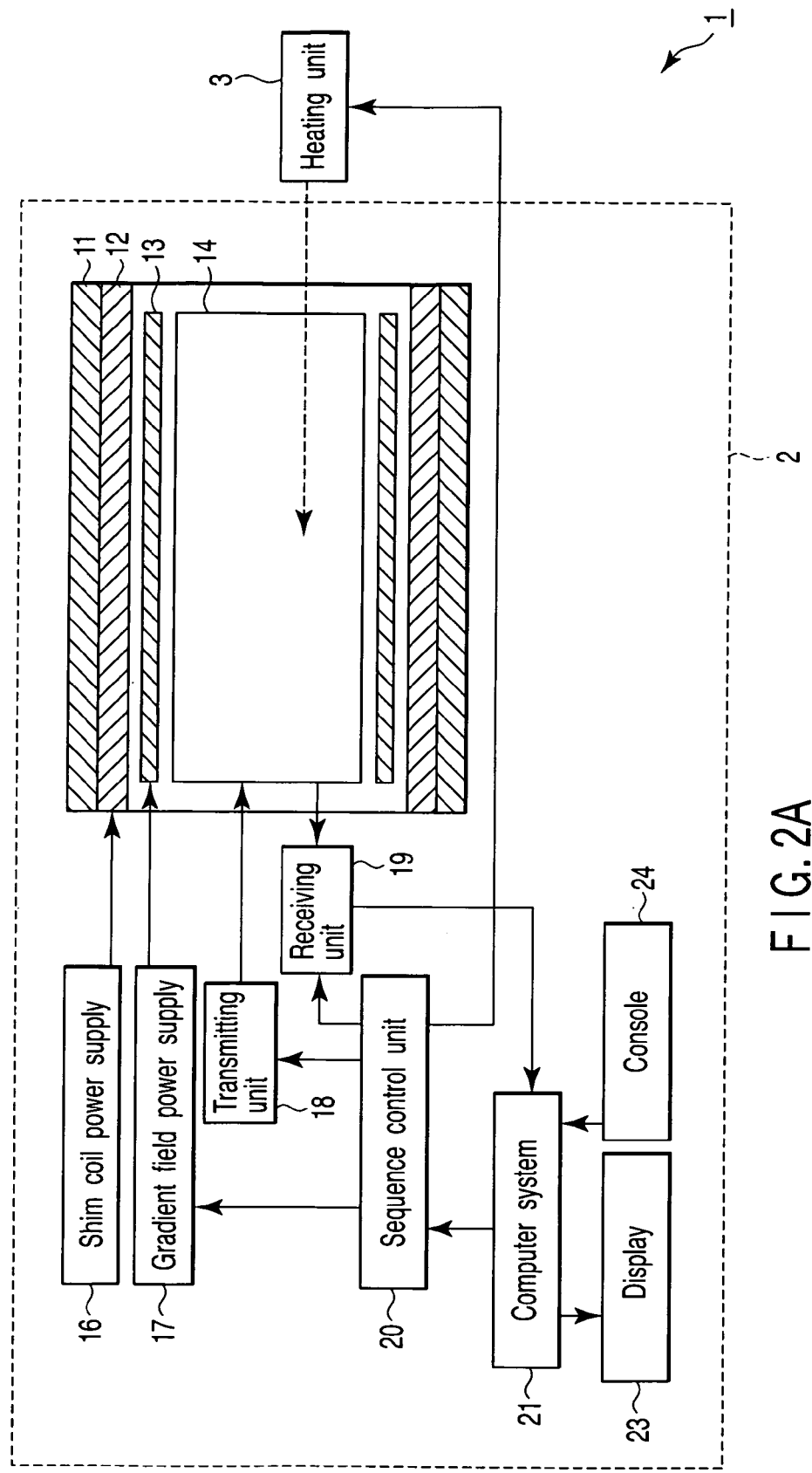
F I G. 2A

MAGNETIC RESONANCE IMAGING SYSTEM AND MAGNETIC RESONANCE IMAGING APPARATUS

BACKGROUND OF THE INVENTION

1. Field of the Invention

The present invention relates to a magnetic resonance imaging system or a magnetic resonance imaging apparatus which is used for the measurement of the temperature of a specific region in thermotherapy using a heating system.

2. Description of the Related Art

A magnetic resonance imaging apparatus is an apparatus which images the chemical and physical microscopic information of a substance or observes a chemical shift spectrum by using a phenomenon in which when a group of nuclei having a unique magnetic moment is placed in a uniform static field, they resonantly absorb the energy of an RF magnetic field that rotates at a specific frequency.

On the other hand, there is available a thermotherapy of selectively destroying tumor tissue by heating a morbid region to a predetermined temperature or more and maintaining the temperature using the difference in thermosensitivity between the tumor tissue and the normal tissue. The treatment result of this thermotherapy greatly depends on temperature management for a region of interest.

A magnetic resonance imaging apparatus can be used for the measurement of the temperature of a treatment region (morbid region) in the above thermotherapy. As a temperature measurement technique using a magnetic resonance imaging apparatus, a temperature distribution measurement method or the like is available, which uses the temperature dependence of a water proton chemical shift as disclosed in, for example, Jpn. Pat. Appln. KOKAI Publication No. 4-055257, U.S. Pat. No. 5,378,987, and the like. In this method, the measurement accuracy is degraded by the influence of the magnetic field nonuniformity of a target region due to the movement or the like of an object to be examined. In order to improve this, as disclosed in, for example, Jpn. Pat. Appln. KOKAI Publication No. 7-55642, there has been proposed a method of correcting an error by using, as a reference value, the phase information of a region exhibiting no temperature change (e.g., a region distant from a temperature measurement target like that shown in FIG. 1A or a fat tissue region exhibiting little temperature dependence).

In a conventional temperature measurement method using a water proton chemical shift, however, a temperature change is calculated on the basis of the phase information of a magnetic resonance signal. For this reason, it is impossible to discriminate whether a measured phase difference is caused by a real temperature change or an error component due to a system variation/movement of an object to be examined.

According to the method of correcting an error by using, as a reference value, the phase information of a substance region exhibiting no temperature change, when the distribution of changes in magnetic field nonuniformity is relatively low order, changes in magnetic field nonuniformity near a target region can be canceled out. If, however, changes in magnetic field nonuniformity exhibit a high-order distribution, an error component due to this cannot be removed.

In addition, according to each of the conventional techniques, when an object to be examined makes an abrupt movement during temperature measurement, discontinuity is observed in the phase value of a magnetic resonance signal as shown in FIG. 1B. For this reason, as shown in FIG. 1C, a temperature change is calculated by using a phase distribution after a phase change as a new reference. As a consequence, the continuous temperature changes from the start of heating processing shown in FIG. 1C cumulatively contain errors due to body movement. Furthermore, if body movement which is not observed as discontinuity occurs, it is impossible to properly discriminate a temperature change due to heating processing from an error due to body movement.

BRIEF SUMMARY OF THE INVENTION

The present invention has been made in consideration of the above situation, and has as its object to provide a magnetic resonance imaging system which can execute temperature measurement with high reliability by removing the influences of magnetic field nonuniformity caused by the movement of the system or an object to be examined on measurement accuracy in a case wherein a heating effect is monitored by magnetic resonance imaging at the time of thermotherapy for a tumor or the like.

According to an aspect of the present invention, there is provided a magnetic resonance imaging apparatus used with a heating device which heats a specific region of an object to be examined, which comprises: magnet unit configured to form a static field space in which the object is to be placed; scan unit configured to execute scan operation of applying a gradient field and an RF wave to the object placed in the static field space and receiving magnetic resonance signal generated in the specific region of the object by application of the gradient field and the RF wave; control unit configured to control the scan unit to execute the scan operation in synchronism with heating by the heating device; and temperature data generating unit configured to generate measurement temperature data on the basis of the magnetic resonance signals obtained by the scan operation.

According to another aspect of the present invention, there is provided a magnetic resonance imaging system including a heating device which heats a specific region of an object to be examined, and a magnetic resonance imaging apparatus which measures a change in temperature of the specific region during the heating, which comprises: magnet unit for forming a static field space in which the object is to be placed; scan unit for executing scan operation of applying a gradient field and an RF wave to the object placed in the static field space and receiving magnetic resonance signal generated in the specific region of the object by application of the gradient field and the RF wave; control unit for controlling the scan unit to execute the imaging operation in synchronism with heating by the heating device; and temperature data generating unit for generating measurement temperature data on the basis of the magnetic resonance signals obtained by the scan operation.

According to yet another aspect of the present invention, there is provided a control method of magnetic resonance imaging apparatus used with a heating device which heats a specific region of an object to be examined, which comprises: executing scan operation of applying a gradient field and an RF wave to the object placed in a static field space and receiving magnetic resonance signal generated in the specific region of the object by application of the gradient field and the RF wave; controlling scan operation timing to execute the imaging operation in synchronism with heating by the heating device; and generating measurement temperature data on the basis of the magnetic resonance signals obtained by the scan operation.

According to yet another aspect of the present invention, there is provided a control method including a heating device which heats a specific region of an object to be examined, and a magnetic resonance imaging apparatus which measures a change in temperature of the specific region during the heating, which comprises: executing scan operation of applying a gradient field and an RF wave to the object placed in a static field space and receiving magnetic resonance signal generated in the specific-region of the object by application of the gradient field and the RF wave; controlling scan operation timing to execute the imaging operation in synchronism with heating by the heating device; and generating measurement temperature data on the basis of the magnetic resonance signals obtained by the scan operation.

BRIEF DESCRIPTION OF THE SEVERAL VIEWS OF THE DRAWING

FIG. 2A is a block diagram showing the arrangement of a magnetic resonance imaging system 1 according to an embodiment;

DETAILED DESCRIPTION OF THE INVENTION

Figure 1A:
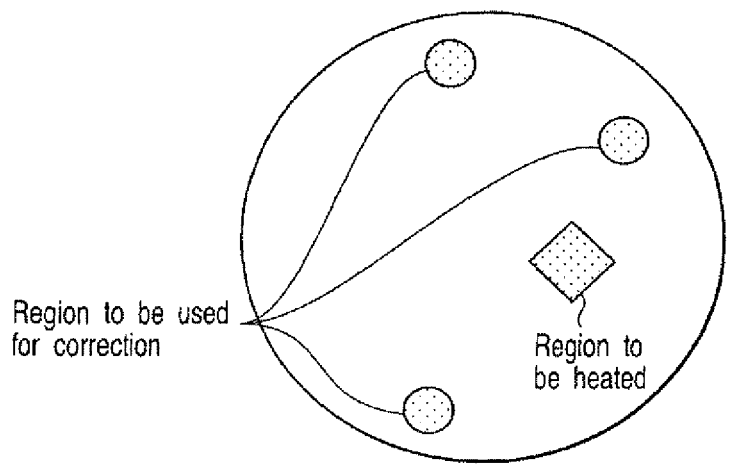
FIG. 1A is a view for explaining temperature measurement by the conventional magnetic resonance imaging apparatus.
Figure 1B:
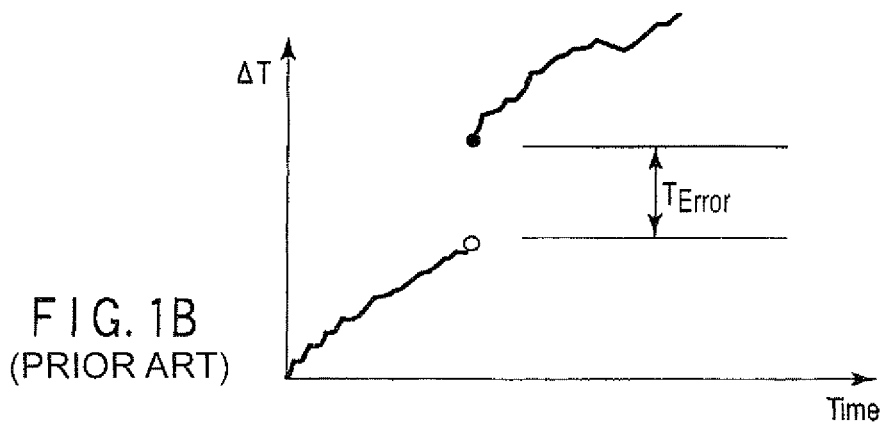
FIG. 1B is a view for explaining temperature measurement by the conventional magnetic resonance imaging apparatus.
Figure 1C:
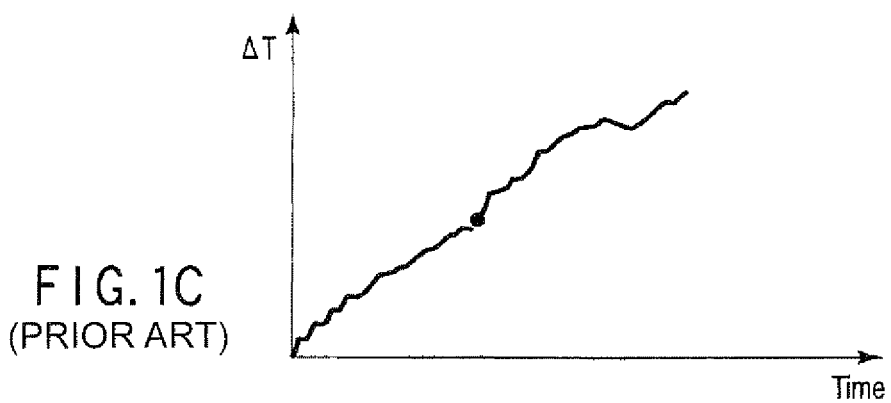
FIG. 1C is a view for explaining temperature measurement by the conventional magnetic resonance imaging apparatus.

An embodiment of the present invention will be described below with reference to the views of the accompanying drawing. Note that the same reference numerals in the following description denote constituent elements having substantially the same functions and arrangements, and a repetitive description will be made only when required.

In the following description, a system comprising a magnetic resonance imaging apparatus and a heating device used to heat a morbid region in thermotherapy will be referred to as a "magnetic resonance imaging system".

FIG. 2A is a block diagram showing the arrangement of a magnetic resonance imaging system 1 according to this embodiment. As shown in FIG. 2A, the magnetic resonance imaging system 1 comprises a magnetic resonance imaging apparatus 2 and a heating unit (heating device) 3. The magnetic resonance imaging apparatus 2 includes a static field magnet 11, shim coil 12, gradient field coil 13, RF probe 14, shim coil power supply 16, gradient field power supply 17, transmitting unit 18, receiving unit 19, sequence control unit 20, computer system 21, display 23 and console 24.

The static field magnet 11 is a magnet which generates a static field. This magnet generates a uniform static field. As the static field magnet 11, for example, a permanent magnet or superconductive magnet is used, and is cooled by a cooling system (not shown).

The shim coil 12 is a coil for actively controlling the uniformity of a magnetic field. Supplying a current to this coil makes it possible to correct low-order components of a static field.

The gradient field coil 13 is a magnetic field coil shorter than the static field magnet 11, and is provided inside the static field magnet 11. The gradient field coil 13 forms gradient fields having linear gradient field distributions in three orthogonal directions, i.e., the X, Y, and Z directions on the basis of pulse currents supplied from the gradient field power supply 17. A signal generation region (position) is specified by the gradient fields generated by the gradient field coil 13.

Note that the Z-axis direction is set to be the same direction as that of a static field (body axis direction of the object) in this embodiment. Assume also that in this embodiment, the gradient field coil 13 and the static field magnet 11 have cylindrical shapes. The gradient field coil 13 may be placed in a vacuum by a predetermined support mechanism. This arrangement is made in consideration of low noise to prevent the vibrations of the gradient field coil 13 which are generated upon application of pulse currents from being transmitted as sound waves to the outside.

The RF probe 14 includes an RF coil for applying RF pulses to an imaging region of the object and receiving magnetic resonance signals generated in the object, and a tuning/matching unit (not shown) for turning the resonance frequency of the RF coil to the frequency of the magnetic resonance signals (e.g., the resonance frequency of a proton).

The shim coil power supply 16 is a power supply which supplies a current to the shim coil 12 at a predetermined timing.

The transmitting unit 18 has an oscillating unit, phase selecting unit, frequency conversion unit, amplitude modulating unit, and RF power amplifying unit (none of which are shown), and transmits RF pulses corresponding to a Larmor frequency to the RF probe 14 for the whole body. The magnetization of a predetermined nucleus of the object is excited by the RF wave generated from the RF probe 14 upon this transmission.

The receiving unit 19 has an amplifying unit, intermediate frequency conversion unit, phase detecting unit, filter, and A/D converter (none of which are shown), and performs predetermined signal processing for each magnetic resonance signal (RF signal) received from each receiver. That is, the receiving unit 19 performs amplification processing, intermediate frequency conversion processing using an oscillation frequency, phase detection processing, filter processing, and A/D conversion processing for the magnetic resonance signal which is emitted when the magnetization of the nucleus relaxes from the excited state to the ground state.

The sequence control unit 20 drives/controls the shim coil power supply 16, gradient field power supply 17, transmitting unit 18, and receiving unit 19 in accordance with a predetermined pulse sequence. In temperature measurement processing (to be described later), in particular, the sequence control unit 20 drives/controls the gradient field power supply 17 and the like so as to measure magnetic resonance signals for temperature measurement in accordance with a sequence (to be described later).

The computer system 21 generates a magnetic resonance image (MR image) by performing predetermined signal processing for magnetic resonance signals received from the receiving unit 19, and controls the operation of the sequence control unit 20 in imaging operation.

Figure 2B:
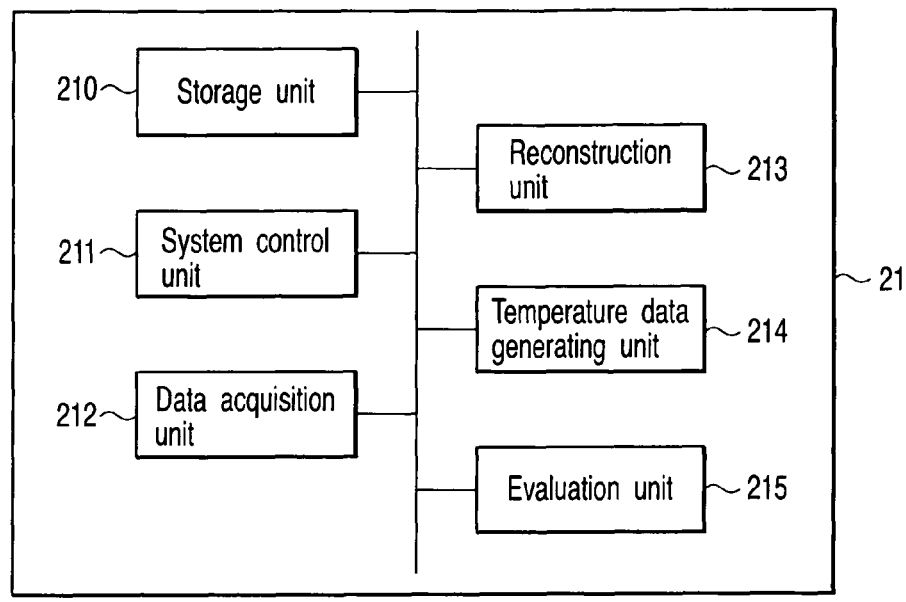
FIG. 2B is a block diagram showing the arrangement of a computer system 21.

FIG. 2B is a block diagram showing the arrangement of the computer system 21. As shown in FIG. 2, the computer system 21 has a storage unit 210, system control unit 211, data acquisition unit 212, reconstruction unit 213, temperature data generating unit 214, and evaluation unit 215.

The storage unit 210 stores magnetic resonance signal data (raw data) before reconstruction which is obtained through the receiving unit 19, magnetic resonance image data reconstructed by the reconstruction unit 213, and the like for each patient.

The system control unit 211 has a CPU, a memory, and the like (none of which are shown), and statically or dynamically controls this magnetic resonance imaging apparatus 2. The system control unit 211 also controls the heating unit 3 according to a predetermined sequence to heat a specific region of the object.

The data acquisition unit 212 acquires the digital signals (magnetic resonance signals) sampled by the receiving unit 19.

The reconstruction unit 213 executes post-processing, i.e., reconstruction such as a Fourier transform, for the data acquired by the data acquisition unit 212 to obtain the spectrum data or image data of a desired nuclear spin inside the object.

Figure 3:
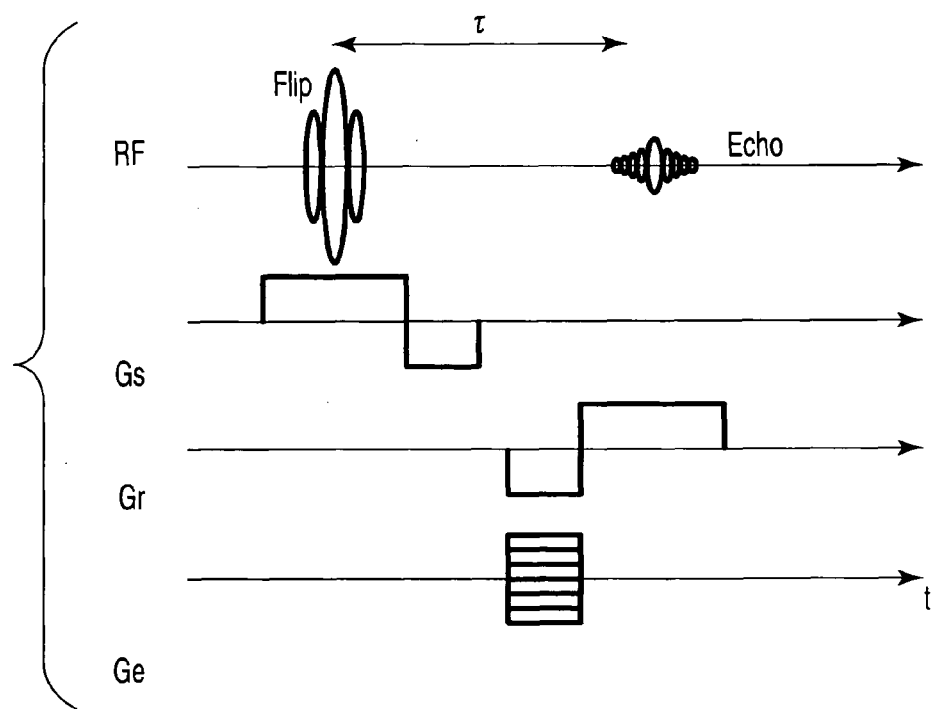
FIG. 3 is a chart showing a scan sequence for temperature measurement executed in synchronism with heating processing.

The temperature data generating unit 214 generates measurement temperature data about a heated region from the magnetic resonance signals, acquired in accordance with a predetermined sequence like that shown in FIG. 3, according to equation (1):

$$\Delta T(x,y,z) = [\theta(x,y,z,) - \theta_0(x,y,z)]/(\alpha\gamma\tau B_0) \quad (1)$$

where $\theta$ is the phase distribution obtained after a temperature change, $\theta_0$ is the reference phase distribution obtained before the temperature change, $\alpha$ is the temperature dependence of a water proton chemical shift, $\gamma$ is the nuclear gyromagnetic ratio, and $\tau$ is the echo time.

This measurement uses the phenomenon that the phase difference between magnetic resonance signals concerning a water proton which are observed before and after a temperature change is proportional to the temperature change. The contents of the processing are described in detail in, for example, Magn. Reson. Med. No. 34 814-823 (1995).

The temperature data generating unit 214 generates morbid region temperature data on the basis of an evaluation processing result (to be described later), measurement temperature data, and the like.

The evaluation unit 215 executes evaluation processing of evaluating whether an error (noise) due to body movement or the like is superimposed on the measurement temperature data generated by the temperature data generating unit 214. This evaluation processing will be described in detail later.

The display 23 is an output device which displays spectrum data, image data, or the like input from a computing device 22 through the computer system 21.

The console 24 has an input device (e.g., a mouse, trackball, mode switch, and keyboard) for inputting various commands, instructions, and information from the operator.

The heating unit 3 is a device which heats a morbid region to a predetermined temperature by the application of ultrasonic waves or the like in thermotherapy. Heating processing by the heating unit 3 is periodically executed on the basis of the control by the magnetic resonance imaging apparatus 2. The application of ultrasonic waves or the like within one period may be continuous or pulse-like operation.
(Heating Control and Temperature Measurement Sequence)

A scan sequence for temperature measurement in thermotherapy which is executed by the magnetic resonance imaging system 1 will be described next.

Figure 4:
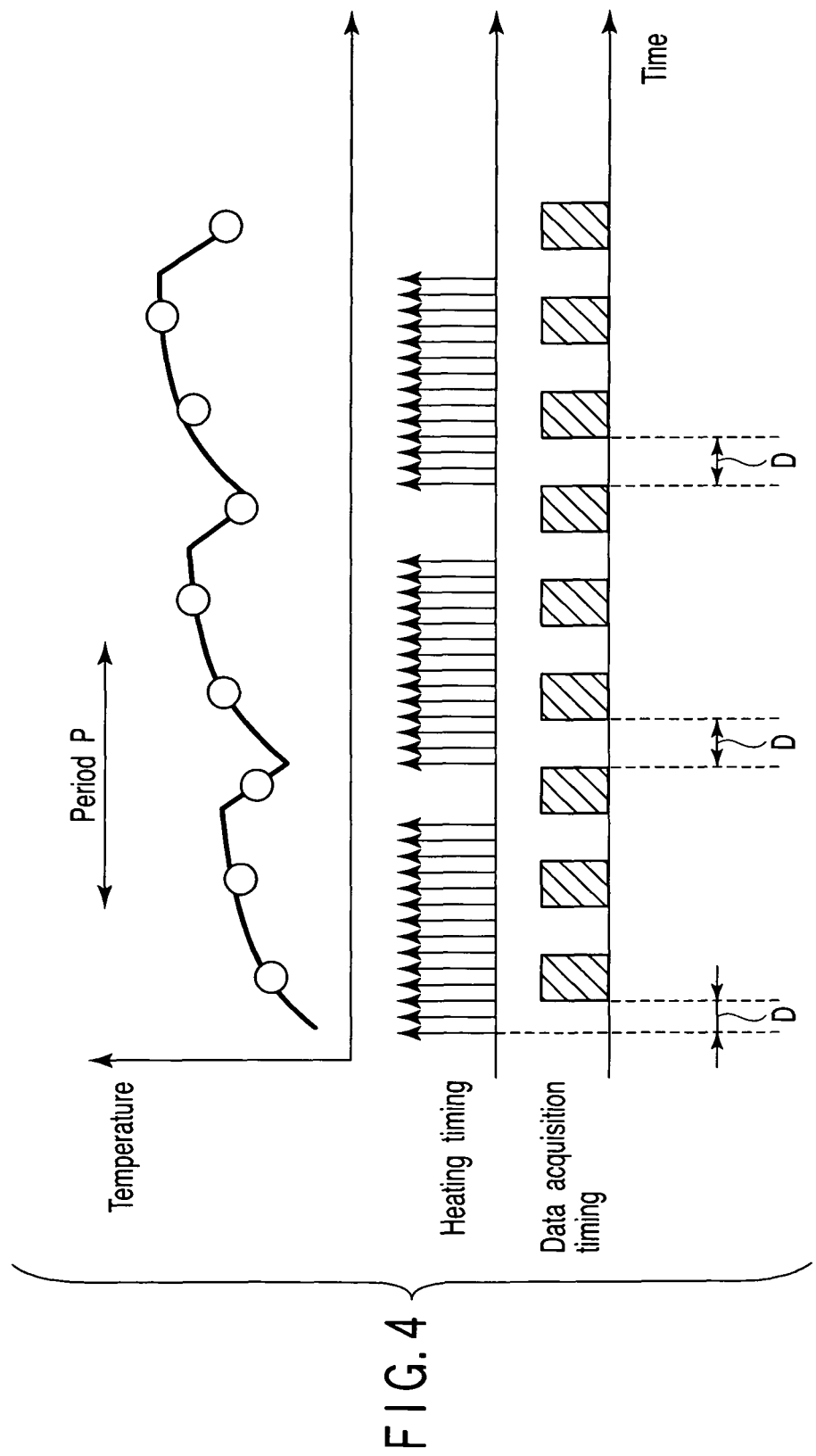
FIG. 4 is a chart for explaining the execution timings of heating processing and a scan sequence for temperature measurement.

FIG. 4 is a graph and a sequence for explaining the relationship between heating processing and the data acquisition of magnetic resonance signals for temperature measurement. Referring to FIG. 4, the uppermost plot is a graph showing relative temperature changes at an object to be heated (a morbid region to be treated). The intermediate plot is a sequence chart showing the heating timing of heating processing executed by the heating unit 3. Each arrow represents one application of ultrasonic waves for heating. The lowermost plot is a sequence showing the data acquisition timing of magnetic resonance signals for temperature measurement which is executed by the magnetic resonance imaging apparatus 2. Each rectangle of this plot represents one scan according to the pulse sequence shown in FIG. 3.

As is obvious from FIG. 4, the intermediate plot and the uppermost plot ON/OFF pattern of heating correlates with a temperature change pattern. In consideration of this point, the magnetic resonance imaging apparatus 2 controls the data acquisition start timing of magnetic resonance signals in synchronism with the timing of heating performed by the heating unit 3. This control is executed by the sequence control unit 20. This synchronized control can provide the following benefits.

Firstly, the phase change of magnetic resonance signals due to body movement occurring in time difference between the heating process and the magnetic resonance signals acquisition can be excluded, for example, by eliminating time difference between the start timing of the heating and the start timing of the magnetic resonance signals acquisition. As a consequence, the superimposition of an error due to the body movement on the temperature data can be prevented.

Figure 5:
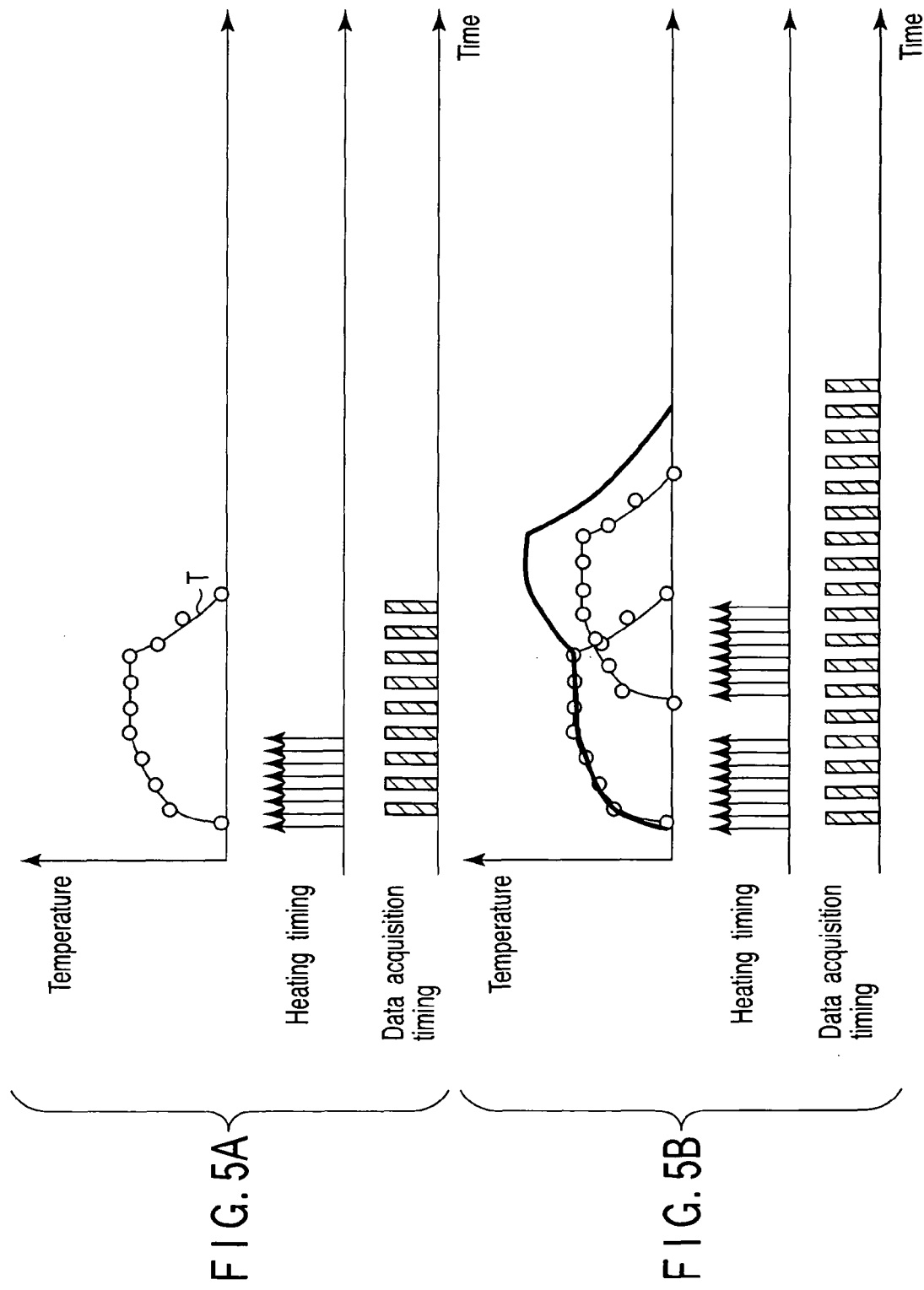
FIGS. 5A and 5B are graphs obtained by plotting measurement temperature data generated by a temperature data generating unit 214 and a reference temperature change pattern.

Secondly, the estimation of temperature rise of an object to be heated due to heating processing can be performed according to the correlation between the ON/OFF pattern of heating and a temperature change pattern on the basis of the synchronized control. As shown in FIG. 5A, the temperature data generating unit 214 evaluates a temperature change pattern based in heating process within one period (e.g., a period of about several ten sec to one min) and obtains a temperature change pattern (reference temperature change pattern) T of the object to be heated which is obtained by heating processing corresponding to one period. Using this reference temperature change pattern makes it possible to estimate a rise in temperature by subsequent heating processing, as shown in FIG. 5B.

It is not generally difficult for a patient to refrain from moving his/her body in heating processing corresponding to one period. If only a reference temperature change pattern is accurately acquired, a rise in temperature by subsequent heating processing can be estimated with high accuracy. This estimation processing can therefore reduce the physical and mental strain on both a doctor and a patient during treatment with the estimation processing.

Note that, in order to acquire a reference temperature change pattern, it is necessary to perform acquisition of magnetic resonance signals according to the pulse sequence as shown in FIG. 3 at least twice in accordance with ON/OFF of heating (i.e., acquisition of magnetic resonance signals which is performed at least twice within one period).

In addition, the number of times of magnetic resonance signal acquisition within one period of the heating processing is preferably controlled in accordance with the heating capacity of the heating unit 3. If, for example, it is expected that the temperature of a morbid region will abruptly change due to heating by strong ultrasonic waves or heating over a relatively long period of time, the number of times of magnetic resonance signal acquisition within one period is preferably increased.

Furthermore, although a reference temperature change pattern is defined as a pattern of temperature change itself in the above case, the pattern may be the phase change pattern of magnetic resonance signals obtained by a scan synchronized with heating processing in one period.

Note that, in the case shown in FIG. 4, it is exemplified that the start timing of the magnetic resonance signals acquisition is synchronized with the delay time D from the start timing of the heating. However, it is not necessary that the delay time D is constant. For example, this delay time D may be determined according to the patient information or the examination type, and controlled actively on the basis of a predetermined condition or manual operation.

(Evaluation Processing for Measurement Temperature Data)

According to the above heating control and heating measurement sequence, it is theoretically conceivable that the heating control pattern obtained in accordance with the above heating control and temperature measurement sequence coincides with a temperature change pattern (phase change pattern). Basically, therefore, preferred temperature measurement can be implemented by synchronizing the above heating processing with temperature measurement.

Assume that the time constant of the temperature change of an object to be examined is long. In this case, even in accordance with the above heating control and temperature measurement sequence, an obtained heating control pattern may not always coincide with a phase change pattern. In such a case, response from heating of a morbid region to temperature rise measurement based on a change in the phase of magnetic resonance signals is delayed. Noise due to body movement in this period (time difference) is superimposed on a magnetic resonance signal from the object. As a consequence, the reliability of measured temperature data deteriorates.

The magnetic resonance imaging apparatus 2 therefore evaluates measurement temperature data on the basis of the correlation between the ON/OFF pattern of heating and a temperature change pattern. This makes it possible to extract only a change in the phase of magnetic resonance signals due to heating processing and obtain temperature data with high reliability even if the time constant of a change in the temperature of the object is long.

Figure 6:
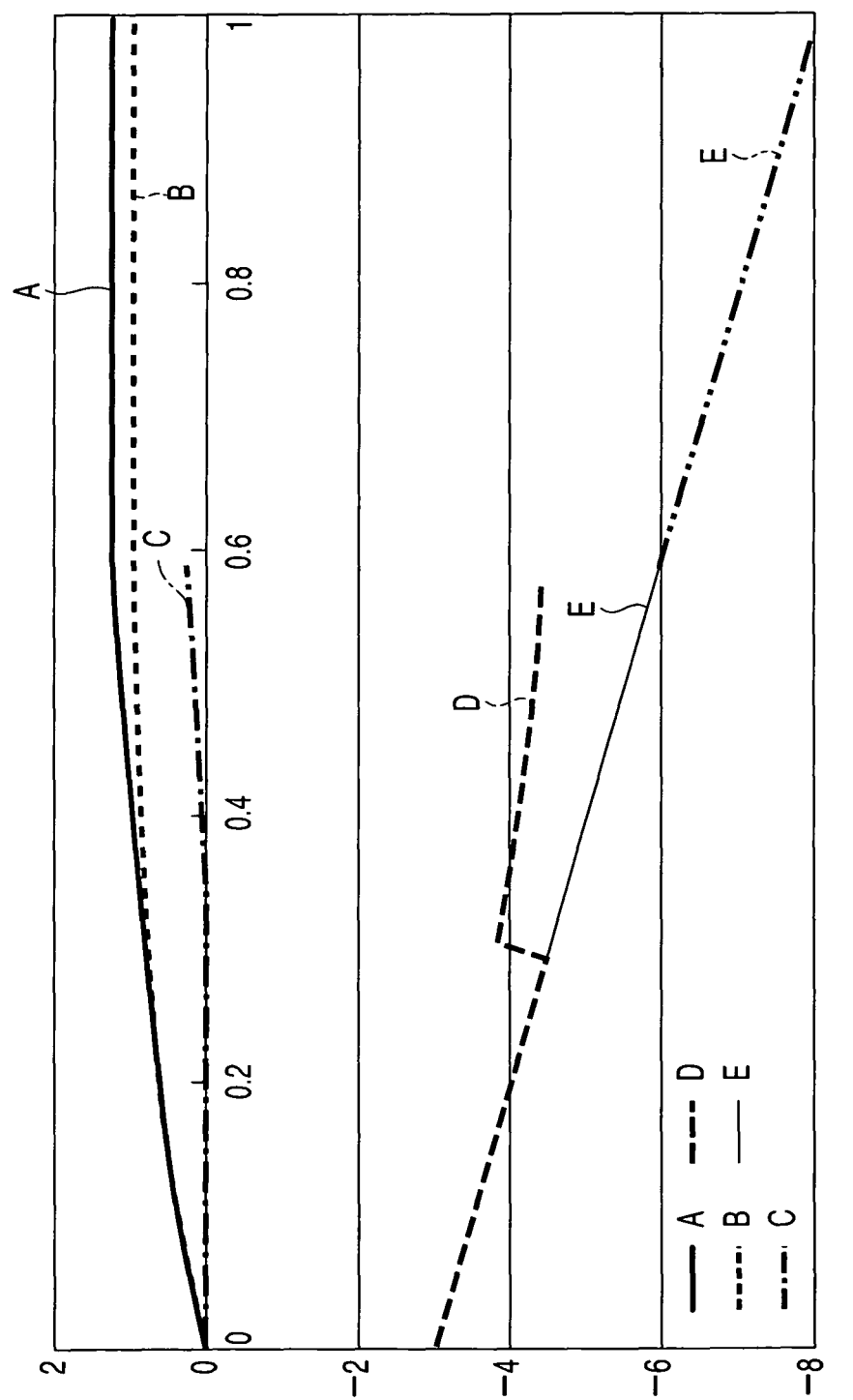
FIG. 6 is a graph for explaining temperature data evaluation processing.

FIG. 6 is a graph for explaining temperature data evaluation processing. Referring to FIG. 6, an original data (line A) represents the actual temperature changes of an object to be examined and heated, a measurement data (line B) represents the temperature changes obtained by the pulse sequence shown in FIG. 3 and calculated by the temperature data generating unit 214 according to equation (1), and a shift data (line C) represents error components accompanying the movement of the living body.

A logarithmic measurement data (line D) is obtained by plotting the logarithms of the respective values of the measurement data B. In addition, a logarithmic original data (line E) is obtained by plotting the logarithms of the respective values of the original data A.

In general, the measurement data B, i.e., the temperature rise curve, basically changes in accordance with an exponential function, and hence the logarithmic measurement data D is plotted on a straight line corresponding to a time constant. For this reason, in an ideal state wherein changes accompanying the movement of an object to be examined and the like are not superimposed on magnetic resonance signals, the logarithmic measurement data D becomes almost identical to the logarithmic original data E, and is expressed as a straight line having a negative slope in a temperature rise area (having a positive slope in a temperature drop area).

In contrast to this, if similar processing is performed for a waveform in a case wherein the above living body has moved, the logarithmic measurement data D indicates a characteristic which deviates from a straight line at a portion where an error has occurred as shown in FIG. 6.

In consideration of this point, in the magnetic resonance imaging apparatus 2, if the logarithmic measurement data D deviates from the predicted logarithmic original data E by a predetermined threshold, the evaluation unit 215 evaluates that an error due to the movement of the living body is superimposed on a detected phase change, and removes the error when morbid region temperature data is generated.

The evaluation unit 215 generates a reference temperature change pattern by performing phase change measurement at least twice in accordance with the above heating control and temperature measurement sequence, and estimates the original data A and the logarithmic original data E on the basis of the pattern. On the other hand, the evaluation unit 215 sequentially plots measurement values and logarithmic measurement values on the basis of the measurement temperature data received from the temperature data generating unit 214. If the plotted logarithmic measurement value deviates from the logarithmic original data E by a predetermined threshold, it is evaluated that an error due to the movement of the living body or the like is superimposed on the logarithmic measurement value, and the corresponding component is removed when morbid region temperature data is generated. When measurement temperature data is removed, final morbid region temperature data is generated on the basis of reference temperature change data.

Note that a threshold for evaluation can be arbitrarily set. In addition, in obtaining the above logarithmic curve, averaging processing of signal values may be performed.

(Heating Processing and Temperature Measurement Processing)

The operation of the magnetic resonance imaging apparatus 2 will be described next.

Figure 7:
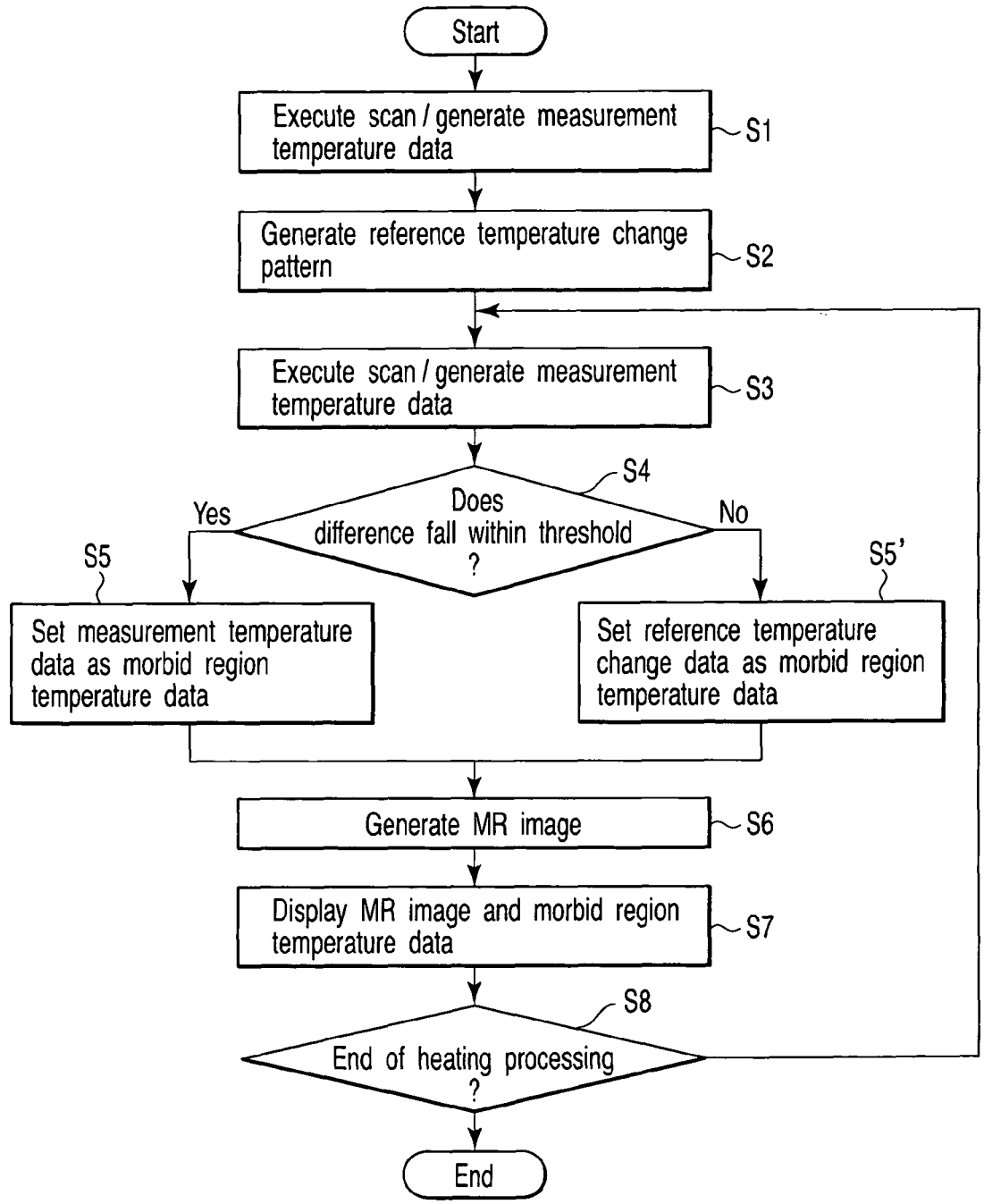
FIG. 7 is a flowchart showing the flow of each process executed in thermotherapy and accompanying temperature measurement.

FIG. 7 is a flowchart showing the flow of each process to be executed in temperature measurement synchronized with thermotherapy. Although not shown in FIG. 7, assume that heating processing for thermotherapy is periodically executed in parallel with temperature measurement in accordance with the sequence shown in FIG. 4 and the like.

First of all, a scan for temperature measurement is executed, and measurement temperature data is generated on the basis of the obtained magnetic resonance signals (step S1). The change pattern (reference temperature change pattern) of the measurement temperature data obtained by heating processing corresponding to one period is generated on the basis of the obtained measurement temperature data (step S2).

In synchronism with further heating processing, measurement temperature data based on a scan for temperature measurement and obtained magnetic resonance signals is generated (step S3).

The reference temperature change pattern is then subtracted from the obtained measurement temperature data, and it is determined whether the difference falls within a predetermined threshold (step S4). If it is determined in step S4 that the difference falls within the threshold, it is determined that the measurement temperature data generated in step S3 is morbid region temperature data (step S5). If it is determined in step S4 that the difference is larger than the threshold, it is determined that the reference temperature change pattern generated in step S2 is morbid region temperature data (step S5'). In addition, MR images are generated on the basis of the magnetic resonance signals which are acquired in the second or the thereafter scan executed in one period of the heating process (step S6). The MR images generated in step S6 are displayed on the display 23 with the morbid region temperature data obtained in step S5 or S5'.

Figure 8:
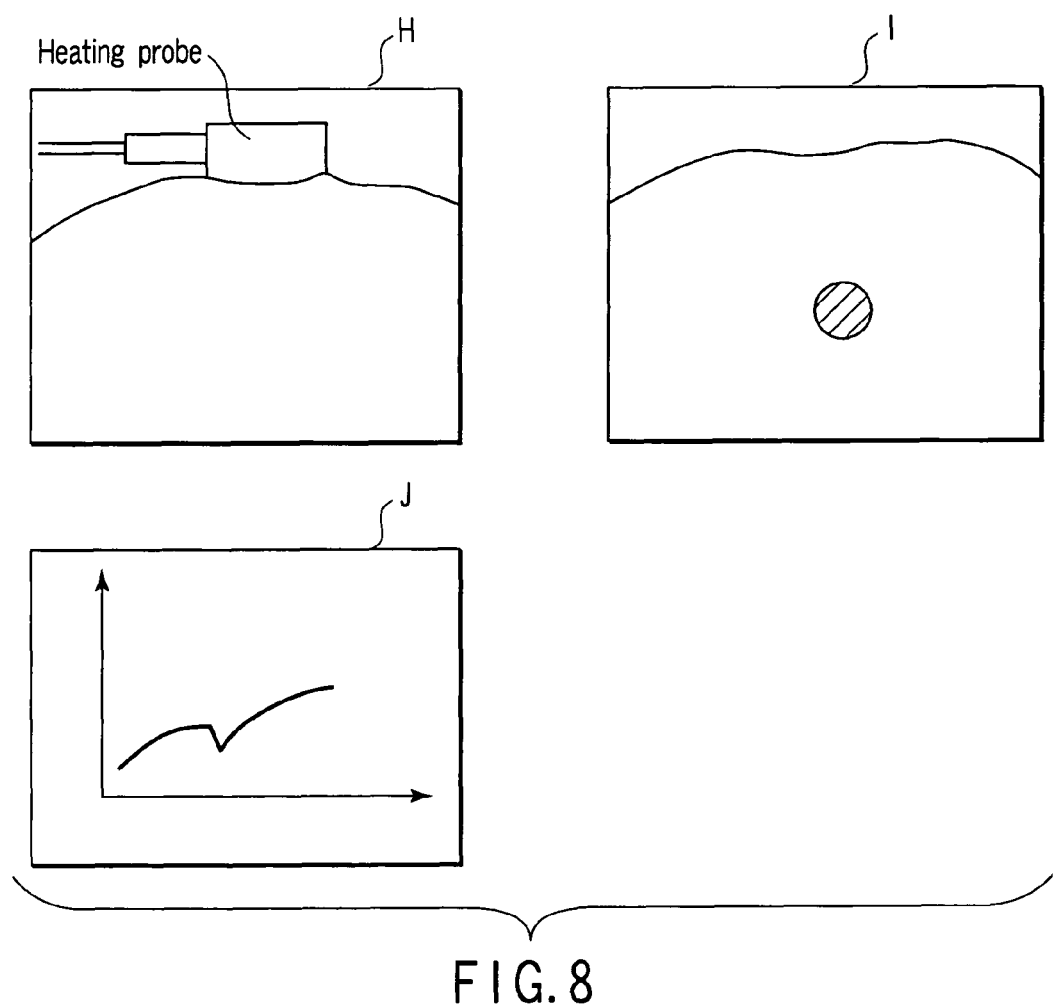
FIG. 8 is a view exemplifying a display configuration in step S7.

FIG. 8 is a view exemplifying a display configuration in step S7. As shown in FIG. 8, The MR image I, the morbid region temperature data J and the image H used in positioning process are displayed at real time in thermotherapy. The doctor or the like can observe each displayed image, and can confirm the position of the heating probe, the position of the morbid region and the temperature change of the morbid region visually.

Note that, the MR image I may be a static image or a dynamic image. If the MR image I is a static image, an image acquired in any scan which corresponds to the second or thereafter scan in a period of the heating process can be used as the MR image. On the other hand, If the MR image I is a dynamic image, the scans more than three times in a period of the heating process are executed to obtain images. The images acquired in the second or thereafter scans in the period of the heating process may be continuously displayed as the MR image.

It is then determined whether the heating processing is to be terminated. If the processing is to be terminated, the temperature measurement processing is also terminated. If the heating processing is to be continued, the processing from step S3 to step S7 is repeated (step S8).

According to the arrangement described above, the following effects can be obtained.

This magnetic resonance imaging system 1 executes a scan in synchronism with the heating control timing so as to eliminate the time difference between heating processing and the acquisition of magnetic resonance signals for temperature measurement. This can therefore prevent superimposition of an error due to body movement which occurs in the time difference between heating processing and the acquisition of magnetic resonance signals. As a consequence, temperature measurement with high reliability can be implemented in thermotherapy and the like.

In this magnetic resonance imaging system 1, a reference temperature change pattern corresponding to heating processing corresponding to one period is estimated, and it is evaluated on the basis of the estimation whether an error due to body movement or the like is superimposed on measurement temperature data. This makes it possible to clearly discriminate a change in the phase of magnetic resonance signals due to the body movement of an object to be examined from a change in the phase of magnetic resonance signals due to heating. As a consequence, highly reliable temperature measurement can be realized in thermotherapy or the like.

Note that the present invention is not limited to the above embodiment, and constituent elements can be modified and embodied in the execution stage within the spirit and scope of the invention.

(1) In the above embodiment, evaluating whether a change in the phase of magnetic resonance signals is due to heating processing or the body movement of an object to be examined is executed by threshold processing. However, the present invention is not limited to this. For example, such evaluation may be performed in consideration of the ratio of the amount of change in the phase of magnetic resonance signals.

More specifically, it is generally considered that a change in the phase of magnetic resonance signals due to the body movement of an object to be examined is linear. On the other hand, it is generally considered that a change in the temperature of a morbid region due to heating processing is nonlinear (e.g., exponential). If, therefore, a reference temperature change pattern is subtracted from a temperature change measured in synchronism with heating processing corresponding to one period, and the difference is almost linear, it can be evaluated that an error due to body movement is superimposed on temperature data measured in correspondence with the period.

(2) In order to improve the measurement accuracy, the technique according to the above embodiment may be combined with the conventional method of correcting a low-order distribution.

(3) The above embodiment has been exemplified that the start and stop timing of the heating process by the heating unit 3 is controlled in the magnetic resonance imaging apparatus 2. However, the imaging system is not limited to the above embodiment. For example, the control unit of the heating unit 3 may control the start and stop timing of the magnetic resonance signal acquisition process by the magnetic resonance imaging apparatus 2. In this case, the same technical effects also can be performed by executing the heating process and the magnetic resonance signal acquisition process according to the sequence exemplified in FIG. 4, FIG. 5A and FIG. 5B.

In addition, various inventions can be formed by proper combinations of a plurality of constituent elements disclosed in the above embodiment. For example, several constituent elements may be omitted from all the constituent elements disclosed in the above embodiment. Furthermore, constituent elements in different embodiments may be properly combined.

What is claimed is:

1. A magnetic resonance imaging (MRI) apparatus configured for use with a separate heating device which heats a specific region of an object to be examined in addition to any heat that may be inherently generated therein by an MR imaging process, said MRI apparatus comprising:
   MRI system components including at least one radio frequency (RF) coil coupled to an imaging volume within a static field magnet and gradient field coils, and an MRI computer system coupled to control said components, said MRI computer system programmed to:
   execute a plurality of successive MRI data acquisition scan operations wherein gradient fields and RF fields are applied to the object placed in the imaging volume and receive magnetic resonance RF signals generated in a specific region of the object;
   control the plurality of MRI data acquisition scan operations in synchronism with each of successive heating cycles by the separate heating device; and
   generate measurement temperature data based on phase differences between magnetic resonance RF signals obtained by the plurality of MRI data acquisition scan operations;
   wherein
   the plurality of MRI data acquisition scan operations are executed at least twice in a single heating cycle period and said magnetic resonance RF signals are received at different timings in synchronization with heating cycles by the separate heating device, and
   (a) a reference temperature change pattern is generated based upon phase differences between said received magnetic resonance RF signals at the different timings, said reference temperature change pattern corresponding to a temperature change of the specific region with respect to a heating cycle by the separate heating device, and (b) a temperature change relating to the specific region is subsequently estimated based upon (i) the reference temperature change pattern and (ii) the measurement temperature data.

2. The MRI apparatus according to claim 1, wherein the plurality of MRI data acquisition scan operations are started in synchronization with start timing of a heating cycle by the heating device.

3. The MRI apparatus according to claim 1, wherein the MRI computer system controls start timing of a heating cycle by the heating device.

4. The MRI apparatus according to claim 1, wherein:
the reference temperature change pattern represents a change in temperature of the specific region based on a phase change of the magnetic resonance RF signals between different data acquisition scan operations in one ON/OFF period of a heating cycle.

5. The MRI apparatus according to claim 4, wherein:
the reference temperature change pattern corresponds to the one ON/OFF period of a heating cycle.

6. The MRI apparatus according to claim 5, wherein the MRI computer system evaluates the measurement temperature data based on the reference temperature change pattern, and temperature data of the specific region of the object is estimated by using (a) the reference temperature change pattern and (b) the measurement temperature data.

7. A system according to claim 6, wherein the evaluation is based on (A) threshold processing associated with a difference between (a) the reference temperature change pattern and (b) the measurement temperature data, or (B) threshold processing associated with a variation over time of the difference.

8. The MRI apparatus according to claim 1, further comprising: said separate heating device.

9. A magnetic resonance imaging (MRI) system comprising:
a separate heating device disposed to heat a specific region of an object to be examined located in an MRI imaging volume, which separate heating device generates heat in addition to any heat that may be inherently generated therein by an MR imaging process;
MRI system components including at least one radio frequency (RF) coil coupled to the imaging volume within a static field magnet and gradient field coils, and an MRI computer system coupled to control said components, said MRI computer system programmed to:
execute a plurality of successive MRI data acquisition scan operations wherein gradient fields and RF fields are applied to the object placed in the imaging volume and receive RF magnetic resonance RF signals generated in the specific region of the object;
control the plurality of MRI data acquisition scan operations in synchronization with each of successive heating cycles by the separate heating device; and
generate measurement temperature data based on phase differences between magnetic resonance RF signals obtained by the plurality of MRI data acquisition scan operations:
wherein
the plurality of MRI data acquisition scan operations are executed at least twice in a single heating cycle period and said magnetic resonance RF signals are received at different timings in synchronization with heating cycles by the separate heating device, and
(a) a reference temperature change pattern is generated based upon phase differences between said received magnetic resonance RF signals at the different timings, said reference temperature change pattern corresponding to a temperature change of the specific region with respect to a heating cycle by the separate heating device, and (b) temperature change relating to the specific region is subsequently estimated based upon (i) the reference temperature change pattern and (ii) the measurement temperature data.

10. A method of controlling magnetic resonance imaging (MRI) apparatus when used with a separate heating device which heats a specific region of an object to be examined, said method comprising use of an MRI system to:
execute a plurality of successive MRI data acquisition scan operations applying gradient fields and RF fields to the object placed in a static magnetic field space and receive magnetic resonance RF signals generated in the specific region of the object;
automatically control the plurality of MRI data acquisition scan operations timing in synchronization with each of successive heating cycles by the separate heating device; and
generate measurement temperature data based on phase differences between magnetic resonance RF signals obtained by the plurality of MRI data acquisition scan operations:
wherein
the plurality of MRI data acquisition scan operations are executed at least twice in a single heating cycle period and said magnetic resonance RF signals are received at different timings in synchronization with heating cycles by the separate heating device, and
a reference temperature change pattern is estimated based upon phase differences between said received magnetic resonance RF signals at the different timings, said reference temperature change pattern corresponding to a temperature change of the specific region with respect to a heating cycle by the separate heating device, and
a temperature change relating to the specific region is subsequently estimated based upon (i) the reference temperature change pattern and (ii) the measurement temperature data.

11. The method according to claim 10, wherein the plurality of MRI data acquisition scan operations is started in synchronization with a start timing of a heating cycle by the heating device.

12. The method according to claim 10, which further comprises controlling a start timing of a heating cycle by the heating device.

13. The method according to claim 10, wherein the plurality of MRI data acquisition scan operations are executed within one ON/OFF period of a heating cycle, and
reference temperature change pattern data which represents a change in temperature of the specific region is generated based on phase changes of magnetic resonance RF signals obtained by the plurality of MRI data acquisition scan operations in one ON/OFF period of a heating cycle.

14. The method according to claim 13, wherein:
the temperature change data is estimated so as to correspond to one ON/OFF period of a heating cycle.

15. The method according to claim 14, which further comprises evaluating the measurement temperature data based on the reference temperature change pattern, and in which
temperature data for the specific region of the object is estimated by using (a) the reference temperature change pattern and (b) the measurement temperature data.

16. The method according to claim 15, wherein the evaluation processing is executed based on (A) threshold processing associated with a difference between (a) the reference temperature change pattern and (b) the measurement temperature data, or (B) threshold processing associated with a variation over time of the difference.

17. A method for using (a) separate heating device which heats a specific region of an object to be examined and which generates heat in addition to any heat that may be inherently generated therein by an MR imaging process, and (b) a magnetic resonance imaging (MRI) apparatus which measures a change in temperature of the specific region during the heating, said method comprising use of an MRI system to:

execute a plurality of successive MRI data acquisition scan operations wherein gradient fields and RF fields are applied to the object placed in a static magnetic field imaging volume space and receiving magnetic resonance RF signals generated in the specific region of the object;

automatically control the plurality of MRI data acquisition scan operations timing in synchronization with each of successive heating cycles by the separate heating device; and generate measurement temperature data based on the magnetic resonance signals obtained by the plurality of MRI data acquisition scan operations;

wherein the plurality of MRI data acquisition scan operations are executed at least twice in a single heating cycle period and said magnetic resonance RF signals are received at different timings in synchronization with heating cycles by the separate heating device, and a reference temperature change pattern is generated based upon phase differences between said received magnetic resonance RF signals at the different timings, said reference temperature change pattern corresponding to a temperature change of the specific region with respect to a heating cycle by the separate heating device, and a temperature change relating to the specific region is subsequently estimated based upon (i) the reference temperature change pattern and (ii) the measurement temperature data.

* * * * *